(12) United States Patent
Buettner et al.

(10) Patent No.: US 10,737,291 B2
(45) Date of Patent: Aug. 11, 2020

(54) SLIDER HAVING ANGLED OR CURVILINEAR SIDEWALLS

(71) Applicant: Seagate Technology LLC, Cupertino, CA (US)

(72) Inventors: Daniel Richard Buettner, Savage, MN (US); Andrew David Habermas, Bloomington, MN (US); Daniel Sullivan, Carver, MN (US); Joseph M. Stephan, Eden Prairie, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/059,627

(22) Filed: Aug. 9, 2018

(65) Prior Publication Data

US 2018/0361427 A1 Dec. 20, 2018

Related U.S. Application Data

(62) Division of application No. 15/354,718, filed on Nov. 17, 2016, now Pat. No. 10,058,890.

(Continued)

(51) Int. Cl.
| | |
|---|---|
| *G11B 5/60* | (2006.01) |
| *B05D 3/06* | (2006.01) |
| *B33Y 10/00* | (2015.01) |
| *B33Y 80/00* | (2015.01) |
| *B29C 59/02* | (2006.01) |

(Continued)

(52) U.S. Cl.
CPC ............... *B05D 3/067* (2013.01); *B05D 3/12* (2013.01); *B05D 7/54* (2013.01); *B29C 59/02* (2013.01); *B29C 59/026* (2013.01); *B33Y 10/00* (2014.12); *B33Y 80/00* (2014.12); *G03F 7/0002* (2013.01); *G11B 5/3106* (2013.01); *G11B 5/3163* (2013.01); *G11B 5/6005* (2013.01); *G11B 5/6082* (2013.01); *B29C 2035/0827* (2013.01);

(Continued)

(58) Field of Classification Search
USPC ............................................. 360/235.9, 236.7
See application file for complete search history.

(56) References Cited

U.S. PATENT DOCUMENTS

| | | | | |
|---|---|---|---|---|
| 5,019,930 A | * | 5/1991 | Takeya ................. | G11B 5/6005 360/122 |
| 5,567,333 A | * | 10/1996 | Hira ..................... | G11B 5/3106 216/22 |

(Continued)

FOREIGN PATENT DOCUMENTS

EP 2597649 A1 5/2013

OTHER PUBLICATIONS

Baguley, "How to Buy a 3D Printer", Tom's Guide, Feb. 22, 2015, retrieved from http://www.tomsguide.com/us/3d-printer-buyers-guide,news-17651.html (12 pages).

(Continued)

*Primary Examiner* — Jefferson A Evans
(74) *Attorney, Agent, or Firm* — Kagan Binder, PLLC

(57) ABSTRACT

The present disclosure includes methods of forming air bearing surfaces having multi-tier structures using nanoimprint technology and/or 3D printing technology. In some embodiments, a single stage of milling can be used to transfer a multi-tier photoresist pattern into a substrate (e.g., an AlTiC substrate).

20 Claims, 12 Drawing Sheets

Related U.S. Application Data

(60) Provisional application No. 62/258,013, filed on Nov. 20, 2015.

(51) Int. Cl.
*G11B 5/31* (2006.01)
*G03F 7/00* (2006.01)
*B05D 3/12* (2006.01)
*B05D 7/00* (2006.01)
*B29C 35/08* (2006.01)

(52) U.S. Cl.
CPC ... *B29C 2059/023* (2013.01); *Y10T 29/49041* (2015.01)

(56) References Cited

U.S. PATENT DOCUMENTS

| | | | |
|---|---|---|---|
| 5,920,978 A * | 7/1999 | Koshikawa | G11B 5/488 29/603.12 |
| 5,973,881 A * | 10/1999 | Ajiki | G11B 5/6005 360/235.8 |
| 6,088,908 A | 7/2000 | Imamura et al. | |
| 6,452,750 B1 * | 9/2002 | Fukuroi | G11B 5/60 360/235.4 |
| 6,535,353 B2 | 3/2003 | Boutaghou et al. | |
| 6,744,601 B2 * | 6/2004 | Brand | G11B 5/60 360/235.6 |
| 6,804,878 B1 * | 10/2004 | Campbell | G11B 5/102 204/192.34 |
| 6,844,144 B2 | 1/2005 | Krause et al. | |
| 6,920,015 B2 * | 7/2005 | Mundt | G11B 11/1058 360/235.6 |
| 6,939,474 B2 | 9/2005 | Eldridge et al. | |
| 7,168,939 B2 | 1/2007 | Bietsch et al. | |
| 8,137,163 B2 * | 3/2012 | Qian | G11B 5/6005 360/235.9 |
| 8,451,556 B1 | 5/2013 | Wang et al. | |
| 8,488,278 B2 * | 7/2013 | Kunkel | G11B 5/6082 360/236.7 |
| 8,771,529 B1 | 7/2014 | Lee et al. | |
| 8,850,980 B2 | 10/2014 | Sreenivasan et al. | |
| 9,093,098 B2 * | 7/2015 | Rajasekharan | G11B 5/6005 |
| 2001/0002159 A1 * | 5/2001 | Morita | G11B 5/012 360/246.1 |
| 2002/0027746 A1 * | 3/2002 | Okawa | G11B 5/6005 360/236.8 |
| 2002/0039256 A1 * | 4/2002 | Polycarpou | G11B 5/6005 360/236.7 |
| 2002/0067575 A1 * | 6/2002 | Brand | G11B 5/60 360/235.6 |
| 2003/0099737 A1 | 5/2003 | Eldridge et al. | |
| 2004/0095680 A1 * | 5/2004 | Takahashi | G11B 5/6005 360/236.3 |
| 2005/0105216 A1 * | 5/2005 | Ueno | G11B 5/6082 360/236.3 |
| 2005/0248884 A1 * | 11/2005 | Peterson | G11B 5/6005 360/235.9 |
| 2006/0096477 A1 | 5/2006 | Bietsch et al. | |
| 2009/0141402 A1 | 6/2009 | Hanyu | |
| 2010/0323924 A1 | 12/2010 | Li et al. | |
| 2012/0025426 A1 | 2/2012 | Kuo et al. | |
| 2012/0138567 A1 | 6/2012 | Hirano et al. | |
| 2013/0170171 A1 | 7/2013 | Wicker et al. | |
| 2013/0300101 A1 | 11/2013 | Wicker et al. | |
| 2014/0254338 A1 | 9/2014 | Habermas et al. | |
| 2015/0049595 A1 | 2/2015 | Smith | |
| 2016/0148631 A1 | 5/2016 | Li et al. | |
| 2017/0158905 A1 | 6/2017 | Oomatsu et al. | |
| 2017/0200459 A1 | 7/2017 | Huang | |
| 2017/0203366 A1 | 7/2017 | Takenami et al. | |

OTHER PUBLICATIONS

"Photonic Professional GT", Nanoscribe GmbH, retrieved from http://www.nanoscribe.de/files/6914/7393/2406/Flyer_PPGT_V03_2016_web.pdf (4 pages).

"IP-Photoresists" Data Sheet, Nanoscribe GmbH, retrieved from http://www.nanoscribe.de/files/1514/7393/1148/Datasheet_IP-Photoresist_V03_2016_web.pdf (2 pages).

"Maskless Lithography", Nanoscribe GmbH, printed on Nov. 4, 2014, retrieved from http://www.nanoscribe.de/en/technology/maskless-laser-lithography/ (1 page).

Bestofmedia Team, "Head Sliders—Hard Drives 101: Magnetic Storage", Tom's Hardware, Aug. 30, 2011, printed on Nov. 15, 2015, retrieved from http://www.tomshardware.com/reviews/hard-drive-magnetic-storage-hdd,3005-4.html (8 pages).

"3D printing on the micrometer scale", Nanoscribe GmbH, printed on Nov. 4, 2014, retrieved from http://www.nanoscribe.de/en/ (2 pages).

"Technology", Nanoscribe GmbH, printed on Nov. 4, 2014, retrieved from http://www.nanoscribe.de/en/technology/ (2 pages).

* cited by examiner

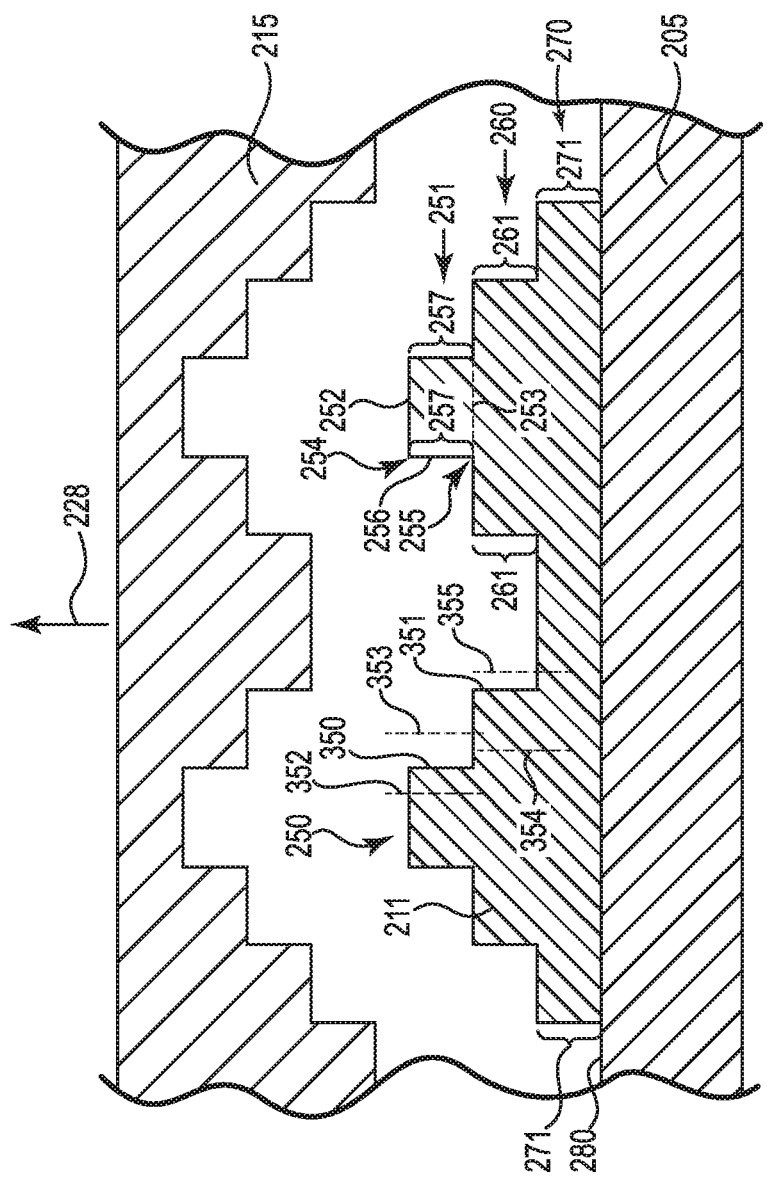

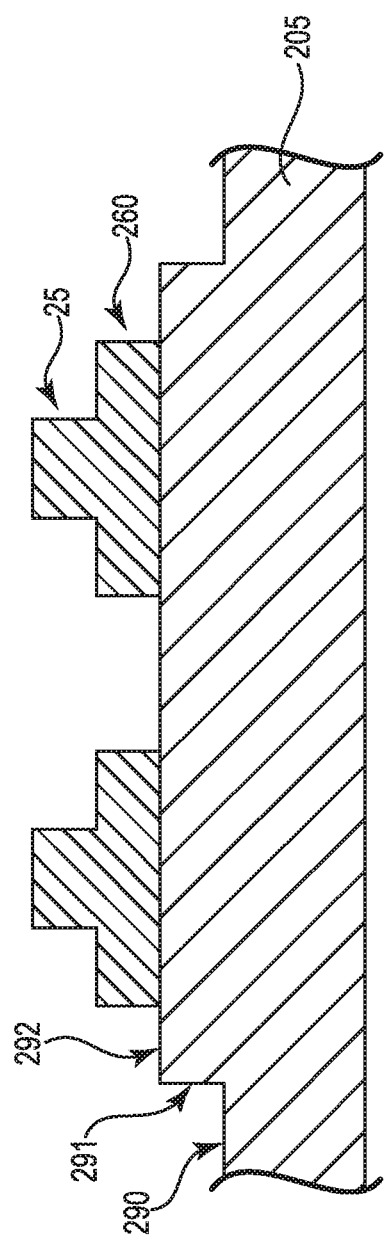

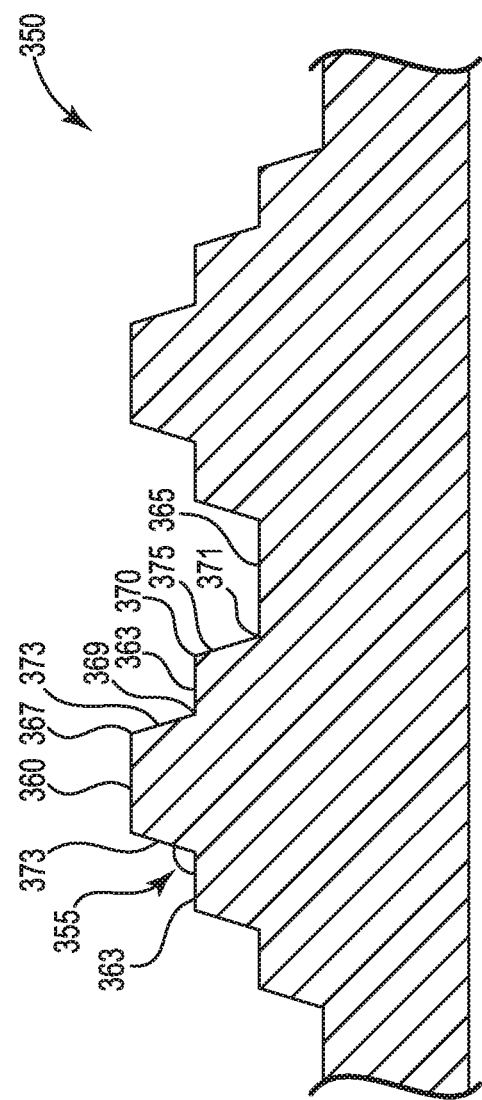

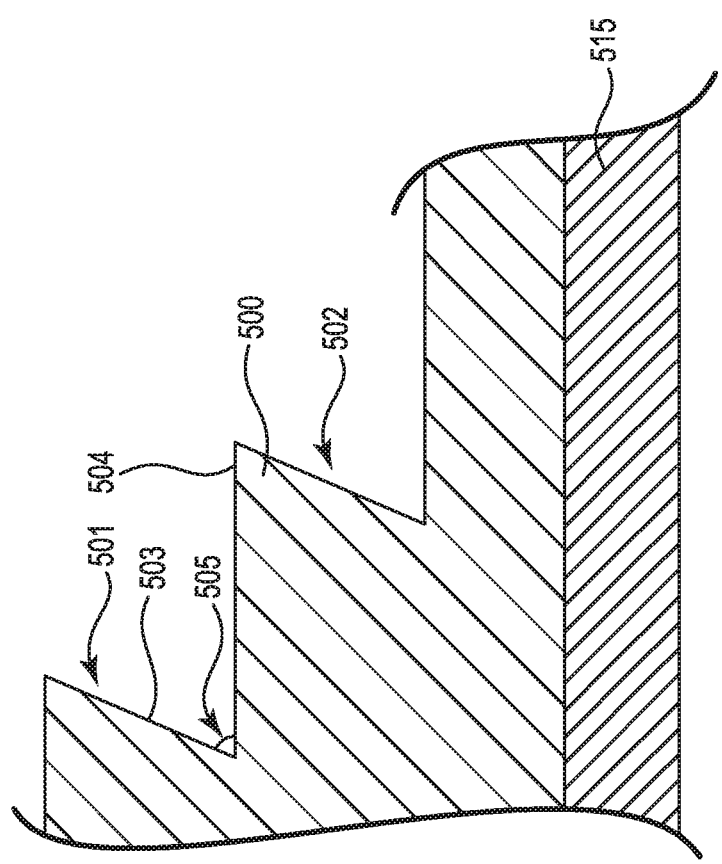

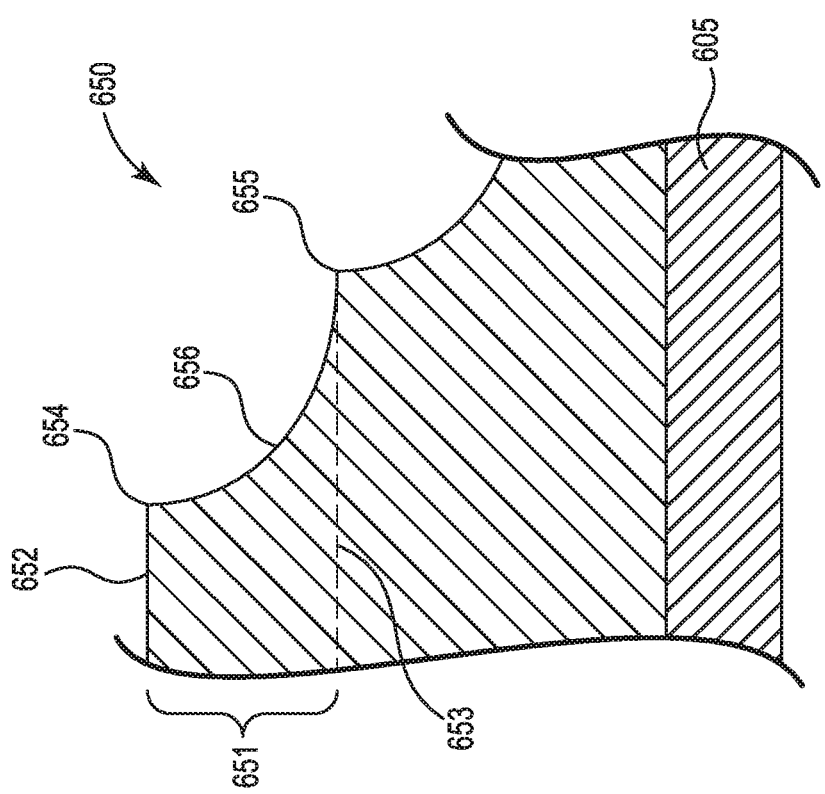

SLIDER HAVING ANGLED OR CURVILINEAR SIDEWALLS

RELATED APPLICATIONS

This application is a divisional patent application of nonprovisional patent application Ser. No. 15/354,718 filed on Nov. 17, 2016, which claims the benefit of provisional Application having Ser. No. 62/258,013, filed on Nov. 20, 2015, wherein said nonprovisional and provisional patent applications are incorporated herein by reference in their entirety.

BACKGROUND

During operation of a disk drive system, an actuator mechanism can move a magnetic transducer (or head) to a desired radial position on the surface of a rotating disk where the transducer electromagnetically reads or writes data. The head can be supported on a body of material referred to as a "slider." A slider can mechanically support the head and any electrical connections between the head and the rest of the disk drive system. The slider can be aerodynamically shaped to glide over moving air and to maintain a uniform distance from the surface of the rotating disk, thereby preventing the head from undesirably contacting the disk.

A slider can be formed with an aerodynamic pattern of protrusions (air bearing pattern) on the air bearing surface (ABS) which enables the slider to fly at a constant height close to the disk during operation of the disk drive. An air bearing slider can be designed to "fly" a slider as closely as possible to a magnetic medium while avoiding physical impact with the medium.

In manufacturing such read/write heads, a large number of sliders (e.g., tens of thousands of sliders) can be fabricated from a single wafer having rows and columns of the magnetic transducers deposited on the wafer surface using semiconductor-type process methods. The ABS can be formed by coating the slider surface with a thick layer of protective photoresist, imaging the photoresist with radiation; development of the ABS image in the photoresist and dry etching (transferring) the ABS image into the body of the slider. After the ABS has been formed, the remaining photoresist can be removed by solvent or plasma ash.

There is a continuing need to find new and improved methods for forming an air bearing surface (ABS) of a slider.

SUMMARY

Embodiments of the present disclosure include a method of forming an air bearing surface of a slider comprising:

providing a slider intermediate comprising a substrate having an air bearing side, wherein the air bearing side has a surface;

depositing an uncured photoresist material on at least a portion of the surface of the air bearing side of the substrate;

contacting the uncured photoresist material with an embossing mold to form a pattern in the uncured photoresist material;

exposing the patterned uncured photoresist material to ultraviolet radiation to at least partially cure the uncured photoresist material so that the at least partially cured photoresist material maintains the pattern after the embossing mold is removed, wherein exposing occurs while the patterned uncured photoresist material is in contact with the embossing mold; and separating the embossing mold from the at least partially cured photoresist material.

Embodiments of the present disclosure also include a method of forming an air bearing surface of a slider comprising:

providing a slider intermediate comprising a substrate having an air bearing side, wherein the air bearing side has a surface;

printing a three-dimensional pattern of a polymeric material on at least a portion of the surface of the air bearing side using 3-D printing.

Embodiments of the present disclosure also include a slider body comprising:

an air bearing face, wherein the air bearing face comprises a leading edge and a trailing edge; two side faces, wherein each side face is adjacent to the air bearing face; and a trailing edge face that is adjacent to the trailing edge of the air bearing face, wherein the air bearing face has a topography comprising at least a first face portion and a second face portion, wherein the first and second face portions are opposite a disc media surface when positioned in a hard disc drive, wherein the first face portion is separated by a distance from the second face portion, wherein the first face portion has an outer periphery and the second face portion has an inner periphery proximal to the outer periphery, wherein a sidewall extends between the outer periphery and the inner periphery, wherein the sidewall is linear or curvilinear, wherein a linear sidewall forms an angle with respect to the second face portion, wherein the angle is greater than 110 degrees or less than 80 degrees.

BRIEF DESCRIPTION OF THE DRAWINGS

FIG. 2C shows a third and subsequent cross-sectional, elevation view of the mold, photoresist, and substrate shown in FIG. 2A;

FIG. 2D shows a fourth and subsequent cross-sectional, elevation view of the photoresist and substrate shown in FIG. 2A;

FIG. 3 shows a cross-sectional, elevation view of an alternative embodiment of a multi-tiered air-bearing face;

FIG. 5 shows a cross-sectional, elevation view of an alternative embodiment of a photoresist pattern and a substrate; and FIG. 6 shows a cross-sectional, elevation view of an alternative embodiment of a photoresist pattern and a substrate.

DETAILED DESCRIPTION

Embodiments of the present disclosure include a method of forming an air bearing surface of a slider, where the air bearing surface includes multiple tiers or regions having different thicknesses. Advantageously, in some embodiments, a method according to the present disclosure can form such multiple tier structures of an air bearing surface via a single stage of etching (e.g., milling).

Exemplary methods of forming an air bearing surface of a slider include forming a photoresist pattern using nanoimprint technology or 3-D printing.

An exemplary embodiment of making an air bearing surface having three tiers via nanoimprint technology is described in connection with FIGS. 1 and 2A-2F. As is described herein below, the three tiered structure made by the nanoimprint technique can advantageously do so using a single UV exposure stage and a single ion milling stage. Nanoimprint lithography (or hot embossing) is a method of fabricating nanometer scale structures on a substrate without the use of the extremely large reduction lens systems in photolithography and with higher throughput than e-beam lithography.

Figure 1:
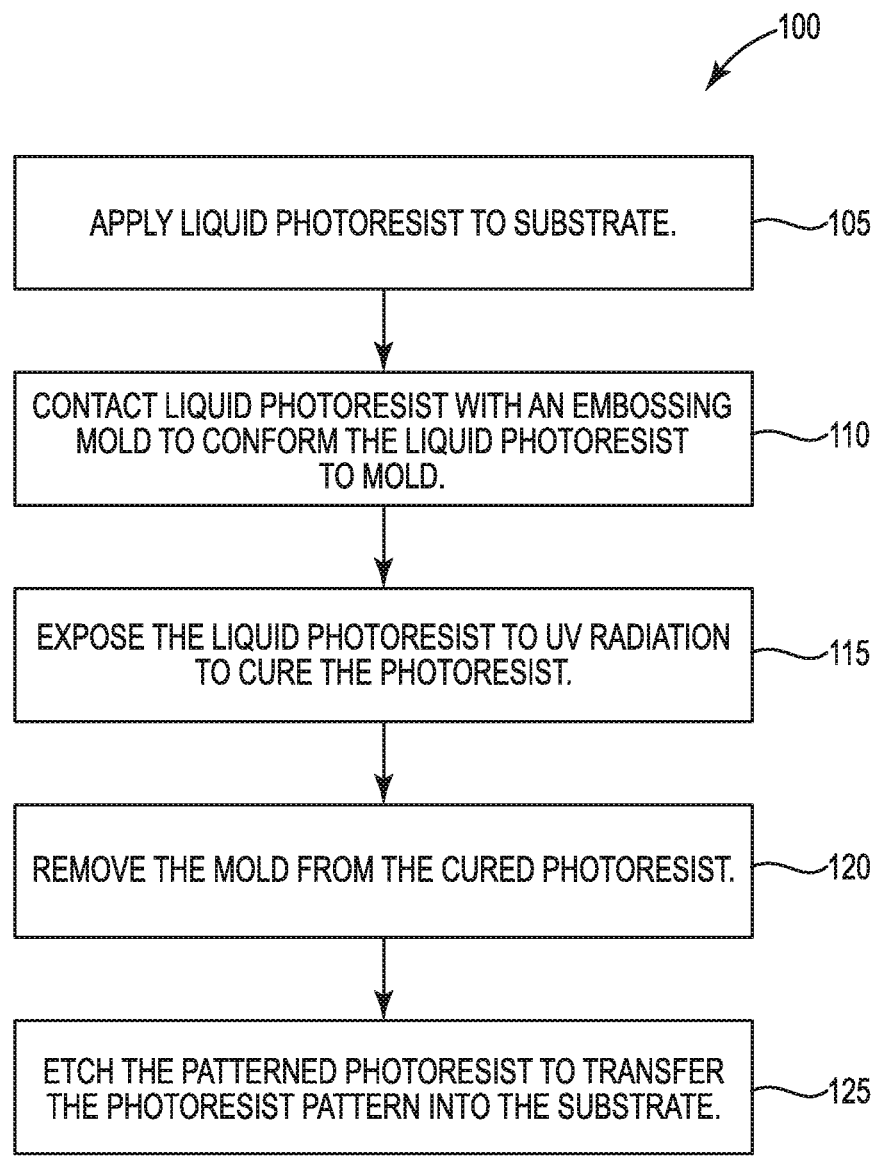
FIG. 1 shows an exemplary process flow diagram for making an air bearing surface according to an embodiment of the present disclosure.
Figure 2A:
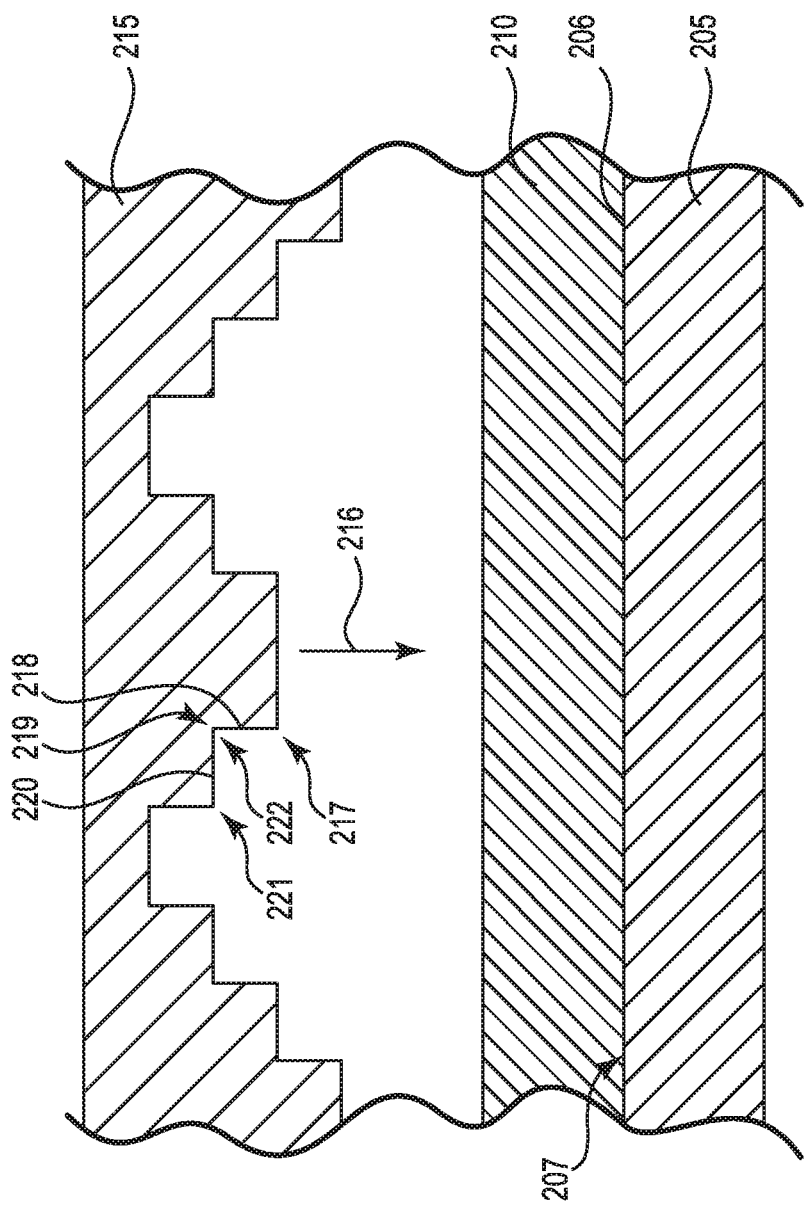
FIG. 2A shows a first cross-sectional, elevation view of an exemplary mold and photoresist for forming a multi-tiered air-bearing surface structure in a substrate.

FIG. 1 shows an exemplary process 100 flow diagram for making an air bearing surface according to an embodiment of the present disclosure. As shown in FIG. 1, the method 100 includes a stage 105 that includes depositing a liquid photoresist on a substrate. FIG. 2A shows a slider intermediate as a substrate 205 having an air bearing side 206, where the air bearing side 206 has a surface 207. As shown in FIG. 2A, an uncured photoresist material 210 is deposited on at least a portion of the surface 207 of the air bearing side 206 of the substrate 205. Substrate 205 includes a planar surface and extends further with the plane than is shown in FIG. 2A.

A wide variety of liquid photoresists can be used in a nanoimprint technique according to the present disclosure. Exemplary liquid photoresists include positive-tone and negative-tone photoresists.

A substrate for forming an air bearing surface of a slider can be made out material that includes ceramic material. In some embodiments, the ceramic material can include a two-phase material of alumina and titanium-carbide (AlTiC). In some embodiments, the substrate can include an amorphous ceramic wafer (e.g., an AlTiC wafer).

Although the portion of the uncured photoresist material 210 shown in FIG. 2A is illustrated as a continuous layer, the photoresist material may be present on the substrate 205 as droplets (not shown) of uncured photoresist material. The uncured photoresist material is liquid and droplets of the photoresist liquid material can be injected onto a substrate in an array of droplets. Further, droplets of photoresist liquid material can be concentrated specifically where they are to be patterned onto a substrate such as substrate 205.

Figure 2B:
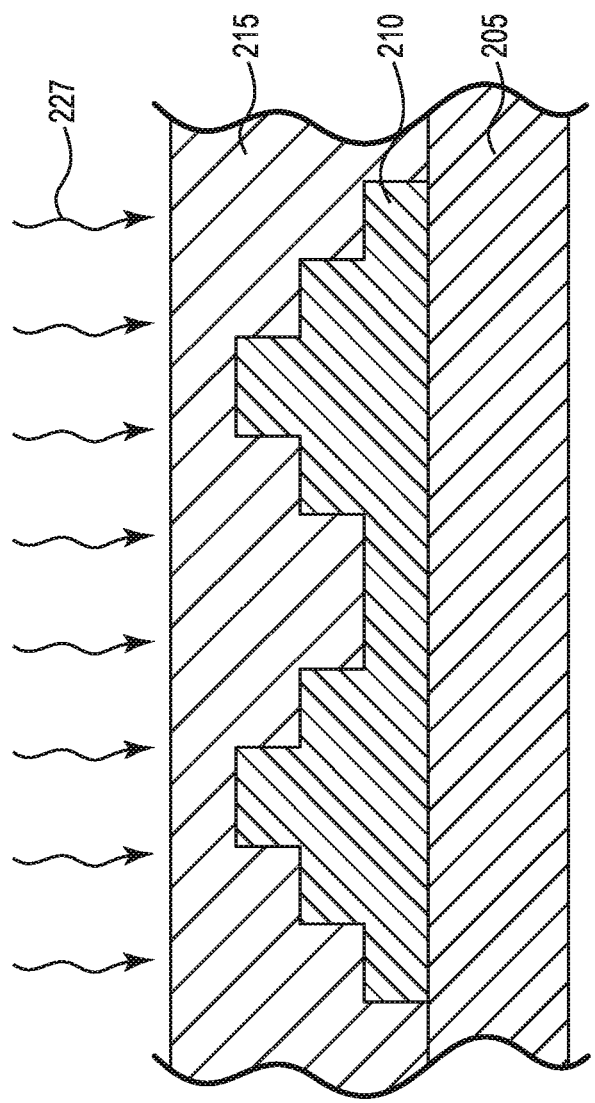
FIG. 2B shows a second and subsequent cross-sectional, elevation view of the mold, photoresist, and substrate shown in FIG. 2A.

As shown in FIG. 1, the next stage 110 of process 100 includes contacting the uncured photoresist material 210 with an embossing mold 215 to form a pattern (as shown, a multi-tiered three dimensional pattern) in the uncured photoresist material 210. As can be seen in FIG. 2A, the embossing mold 215 is positioned over substrate 205 and uncured photoresist material 210 and is lowered in the direction of arrow 216 toward the uncured photoresist material 210 and substrate 205. The embossing mold 215 includes features (e.g., features 217-221) to be reproduced in cured photoresist material, and ultimately into the substrate 205. Each of the features in the embossing mold 215 help define dimensions (e.g., height, width, and length) that correspond to the dimensions of a pattern to be reproduced in cured photoresist material, and ultimately into the substrate 205. As shown in FIGS. 2A and 2B, the features (e.g., 217-221) of the embossing mold 215 define recesses (e.g., recess 222) that fill with liquid uncured photoresist material 210 as the embossing mold is lowered toward substrate 205 and into contact with the liquid photoresist material 210. As shown in FIG. 2A, embossing mold 215 includes corners 217, 219, and 221 and walls 218 and 220 that help define recess 222. Recess 222 helps define a portion of a tier formed in a photoresist pattern as discussed below.

As shown in FIG. 1, the next stage 115 of process 100 includes exposing the patterned uncured photoresist material to ultraviolet radiation to at least partially cure (e.g., to substantially completely cure) the uncured photoresist material so that the cured photoresist material maintains the pattern that corresponds to the embossing mold after the embossing mold is removed. As shown in FIG. 2B, ultraviolet radiation is illustrated by arrows 227 and can transmit through embossing mold 215 to cure the photoresist material 210. An embossing mold can be made out materials that permit ultraviolet radiation to sufficiently transmit through the mold and cure the photoresist material. Exemplary materials that can be used to make an embossing mold include quartz, polycarbonate, fused silica, and the like. Optionally, thermal radiation may help cure photoresist material in an embossing mold.

Also, as shown in FIG. 2B, the uncured photoresist material is exposed to the ultraviolet radiation while the patterned uncured photoresist material 210 is in contact with the embossing mold 215.

As shown in FIG. 1, the next stage 120 in process 100 includes separating the embossing mold from the at least partially cured photoresist material. As shown in FIG. 2C, the embossing mold 215 is removed (as indicated by arrow 228) from the at least partially cured (e.g., substantially completely cured) photoresist material 211. The photoresist material is cured to a degree so that it maintains the corresponding shape of the embossing mold 215 after the embossing mold 215 is removed.

Optionally, one or more additives can be used in forming pattern 250 on substrate 205. For example, a release agent can be used to help mold 215 release from pattern 250. As another example, an adhesion promoter can be used to help pattern 250 adhere to substrate 205.

The pattern 250 formed in the cured photoresist material 211 is multi-tiered as defined by multiple layers in cross-section. In some embodiments, a pattern according to the present disclosure can include two or more layers. As shown in FIG. 2C, pattern 250 includes three tiers or layers 251, 260, and 270. Layer 251 has a cross-sectional profile defined by a first major surface 252 separated by a distance from a second major surface 253 (shown by dotted line). The first major surface 252 has a first outer periphery 254 and the second major surface 253 has a second outer periphery 255 proximal to the first outer periphery 254. A sidewall 256 extends between the first outer periphery 254 and the second outer periphery 255. As shown in FIG. 2C, the sidewall 256 is linear and forms a right angle with respect to the second major surface 253.

Layers 251, 260, and 270 each have outer peripheral region 257, 261, and 271, respectively, in cross-section. Layer 270 underlies overlaying layer 260 and the outer peripheral region 271 extends beyond the outer peripheral region 261 of said overlying layer 260. Likewise, layer 260 underlies overlaying layer 251 and the outer peripheral region 261 extends beyond the outer peripheral region 257 of said overlying layer 251, thereby forming a three-tiered structure.

As shown in FIG. 1, the next stage 125 includes removing pattern 250 in a manner that transfers the pattern into the air bearing side 206 of the substrate 205. The pattern can be removed via a variety of techniques such as milling. An example of milling includes ion milling with argon.

An example of ion milling is described herein below. After a first time period of, e.g., subjecting the pattern 250 and substrate 205 to ion milling in stage 125 a portion of the unprotected (unmasked) portion 280 of substrate 205 is removed while the portions of layers 251, 260, and 270 of cured photoresist are also removed. FIG. 2D shows the new surface 290 and ledge 291 that are formed in substrate 205 after the portion of layer 270 of cured photoresist extending past the outer peripheral regions 257 and 261 has been removed via ion milling. FIG. 2D also shows that removing the portion of layer 270 of cured photoresist extending past the outer peripheral regions 257 and 261 exposes surface 292 of underlying substrate 205.

Figure 2E:
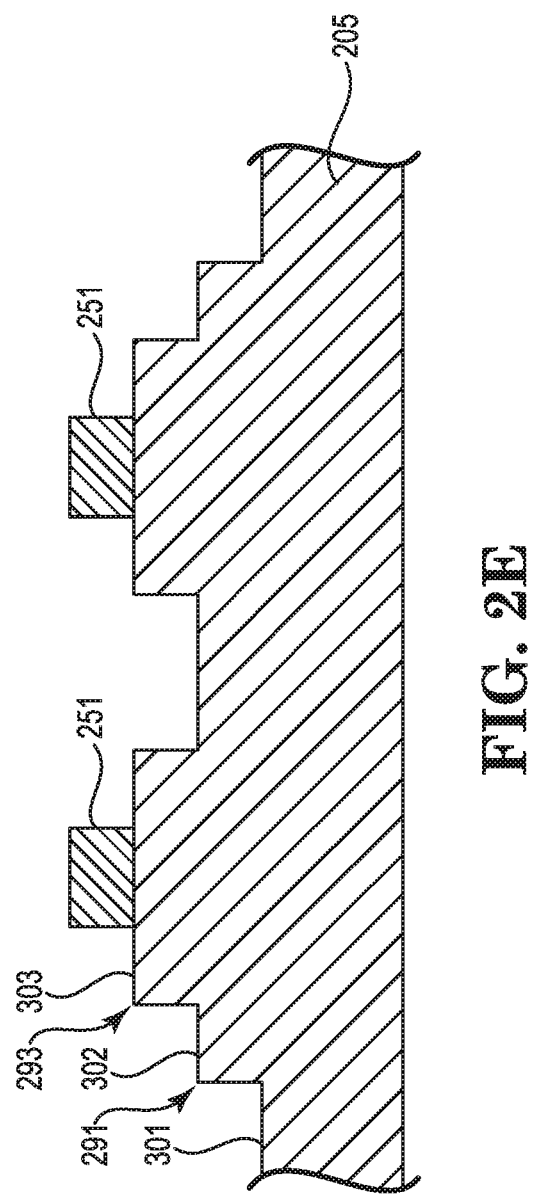
FIG. 2E shows a fifth and subsequent cross-sectional, elevation view of the photoresist and substrate shown in FIG. 2A.

After a second time period of, e.g., subjecting the pattern 250 and substrate 205 to ion milling in stage 125 a portion of the unprotected (unmasked) portions 290 and 292 of substrate 205 are removed while additional portions of layers 251 and 260 of cured photoresist are also removed. FIG. 2E shows the new surfaces 301 and 302 are formed so as to help define ledges 291 and 293 in substrate 205 after the portion of layer 260 of cured photoresist extending past the outer peripheral region 257 has been removed via ion milling. FIG. 2E also shows that removing the portion of layer 260 of cured photoresist extending past the outer peripheral region 257 exposes surface 303 of underlying substrate 205.

Figure 2F:
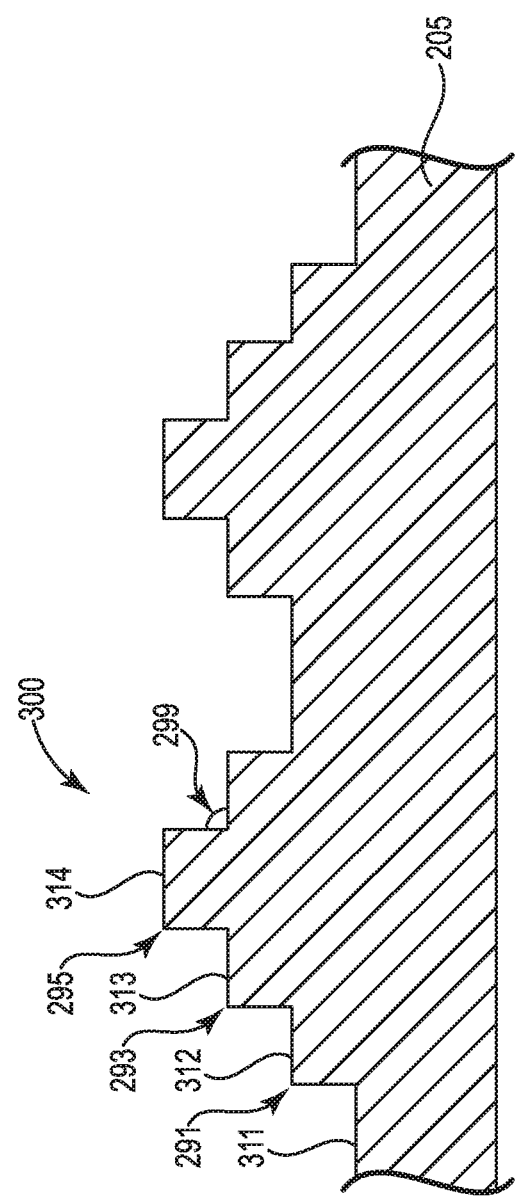
FIG. 2F shows a sixth and subsequent cross-sectional, elevation view of the substrate shown in FIG. 2A.

After a third time period of subjecting the pattern 250 and substrate 205 to ion milling in stage 125 a portion of the unprotected (unmasked) portions 301, 302, and 303 of substrate 205 are removed while the remaining portion of layer 251 of cured photoresist is also removed. FIG. 2F shows the new surfaces 311, 312 and 313 are formed so as to help define ledges 291, 293, and 295 in substrate 205 after the remaining portion of layer 251 of cured photoresist has been removed via ion milling. FIG. 2F also shows that removing the remaining portion of layer 251 of cured photoresist exposes surface 314 of underlying substrate 205.

As can be seen by comparing FIGS. 2C and 2F, the photoresist pattern 250 can be transferred into substrate 205 as structure 300 in a single stage of photoresist curing and a single stage of ion milling. As shown in FIG. 2F the sidewalls in structure 300 are oriented at an angle 299 of 90 degrees relative to the vertical dimension.

The depth of each ledge 291, 293, and 295 in structure 300 can be chosen to provide desired flying characteristics in a slider. To facilitate this, the selectivity of ion milling among the photoresist polymer and substrate can help determine the ratio of the thickness of each photoresist layer relative to the thickness of each ledge that is milled into the substrate.

Advantageously, a method of forming an air bearing surface according to the present disclosure can reduce or eliminate defects. For example, if a layer of photoresist has a particle on its surface, then the shape of that particle can be transferred to substrate as a "hill". Exemplary sources of particle contamination include substrate handling during and/or between each stage of manufacture. For example, repeating stages of forming, exposing, and milling to create a multi-tier structure in an air bearing surface can increase the chance of having particles contaminate the surface of photoresist. Forming a multi-tiered structure such as structure 300 in a single stage of photoresist forming and curing and a single stage of ion milling can reduce the number of times that such stages are repeated, thereby decreasing the chance of defects. Further, a single stage of photoresist forming and curing can mean less overall handling of the slider and decrease the risk of scratching that may occur due to less interaction with tools, carriers, and the like.

Further, reducing multiples stages of photoresist forming to 1 stage of photoresist forming and reducing multiple stages of milling to 1 stage of milling can reduce process content and time. Because of such time and cost savings, there is an opportunity to increase the complexity and number of levels or tiers while still being cost-effective.

Also, a method of forming an air bearing surface according to the present disclosure can improve control of mis-registration among multiple tiers. For example, as shown in FIG. 2C, if layer 260 is formed in a stage followed by a stage of ion milling, the sidewall 351 may mis-register within a range indicated by dotted lines 354 and 355. If layer 251 is subsequently formed after milling layer 260, then the sidewall 350 may also mis-register within a range indicated by dotted lines 352 and 353. These mis-registrations are then translated in the underlying substrate and can introduce a wide range of cumulative shifts as the number of tiers increases using repeating stages of photoresist forming and milling. However, forming a multi-tiered structure such as structure 300 in a single stage of photoresist forming and curing and a single stage of ion milling can improve mis-registration among multiple tiers. Embossing mold 215 can be made using high-grade lithography to mis-registration among the tiers.

In addition, a method of forming an air bearing surface according to the present disclosure can improve control of critical dimension errors that may be caused by exposure dose and focus. Because embossing mold 215 forms multiple tiers in a single step, critical dimension errors caused by exposure dose and focus using masks in multiple steps becomes less of a factor. Embossing mold 215 can be made using high-grade lithography to control critical dimensions among the tiers.

Forming a photoresist layer using a template (i.e., nanoimprint technology) for thin film heads is described in U.S. Publication Number 2014/0254338 (Habermas et al.), the entirety of which publication is incorporated herein for all purposes.

A three tiered structure such as 300 can also be made using a single ion milling stage, where the pattern that is transferred into a substrate is made by 3-D printing the pattern of polymeric material onto a substrate. Embodiments of the present disclosure include a method of forming an air bearing surface of a slider that includes: providing a slider intermediate comprising a substrate having an air bearing side (where the air bearing side has a surface); and printing a three-dimensional pattern of a polymeric material on at least a portion of the surface of the air bearing side using 3-D printing. An example of a slider intermediate having an air bearing side is described above with respect to FIG. 2A.

For illustration purposes, a 3-D printing system can include a printing head having a plurality of ink-jet nozzles, through which an uncured polymeric material can be jetted, and a curing unit for curing the polymeric material to form a three-dimensional nanostructure such as pattern 250. A three-dimensional nanostructure similar to pattern 250 can be built up in layers, the depth of each layer being controllable by selectively adjusting the output from each of the plurality of ink-jet nozzles. A 3-D printing system can also include a process controller and a Computer Aided Design (CAD) system. The process controller can be coupled to CAD system, curing unit, and printing head. In 3-D printing, a three-dimensional nanostructure similar to pattern 250 in FIG. 2C can be designed in 3-D printer compatible CAD software and implemented in a 3-D laser lithography system, such as the system commercially available under the tradename Photonic Professional GT laser lithography system from Nanoscribe GmbH. Another exemplary 3-D printing technology that can print pattern 250 is commercially available under the tradename Dip-in Laser Lithography from Nanoscribe GmbH.

A variety of polymeric materials can be used to make three-dimensional nanostructures such as pattern 250 via 3-D printing. Exemplary polymeric materials include photopolymers containing ultra violet (UV) or infra-red (1R) curable material. For example, material based on reactive acrylates is suitable for UV curing or hardening by the application of UV radiation. Exemplary UV-curable photopolymers include those that can be polymerized via two-photon polymerization. UV-curable photopolymers that can be polymerized via two-photon polymerization are commercially available, e.g., under the tradenames IP-L, IP-G, and IP-L 780 from Nanoscribe GmbH.

After forming a three-dimensional nanostructure such as pattern 250 via 3-D printing, the pattern can be can be milled as similarly described above with respect to FIGS. 2C-F so that the pattern is transferred into the air bearing side of the substrate.

Embodiments of the present disclosure can form multi-tier air bearing surfaces having alternative sidewall profiles between each tier that are less than or greater than 90 degrees. For example, as shown in FIG. 3, structure 350 forms an air bear surface of a slider, where the air bearing surface has a leading edge (not shown) and a trailing edge (not shown). As shown, structure 350 has a topography that includes face portions 360, 363, and 365 that are opposite a disc media surface (not shown) when positioned in a hard disc drive (not shown). The first face portion 360 is separated by a distance from the second face portion 363. The first face portion 360 has an outer periphery 367 and the second face portion 363 has an inner periphery 369 proximal to the outer periphery 367. Sidewall 373 extends between the outer periphery 367 and the inner periphery 369. A sidewall can be linear or curvilinear. If the sidewall is linear, the sidewall forms an angle with respect to the second face portion that is greater than 110 degrees or less than 80 degrees. As shown, sidewall 373 is linear and forms an obtuse angle 355 with respect to the second face portion 363 that is greater than 110 degrees. In some embodiments, the sidewall 373 is linear and forms an angle 355 with respect to the second face portion 363 that is between 120 and 150 degrees.

The second face portion 363 is separated by a distance from the third face portion 365. The second face portion 363 has an outer periphery 370 and the third face portion 365 has an inner periphery 371 proximal to the outer periphery 370. Sidewall 375 extends between the outer periphery 370 and the inner periphery 371. Sidewall 375 is linear and forms an obtuse angle with respect to the third face portion 365.

Figure 4A:
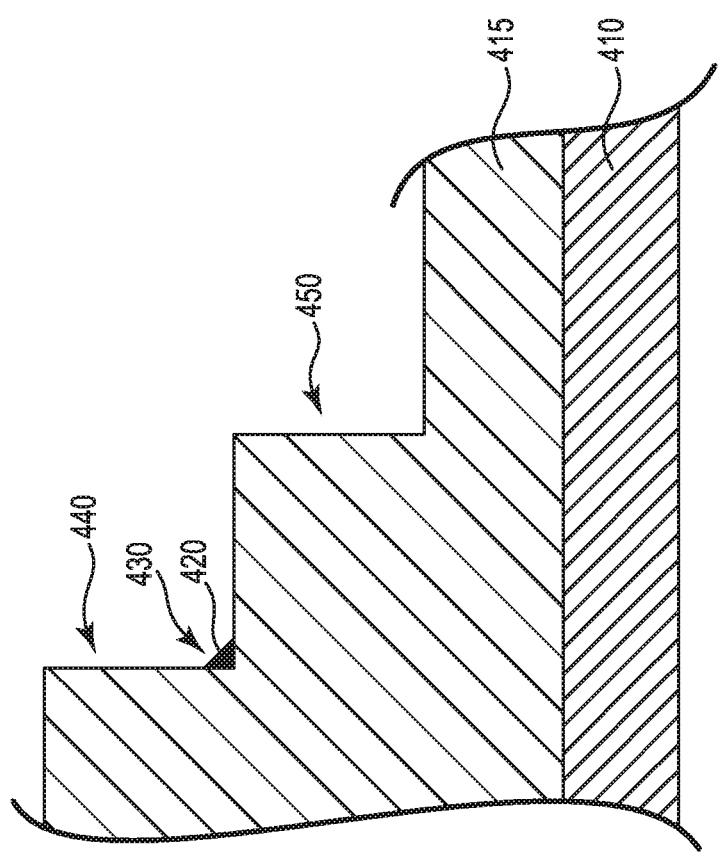
FIG. 4A shows a cross-sectional, elevation view of a photoresist pattern on a substrate to make an air-bearing surface of a slider.
Figure 4B:
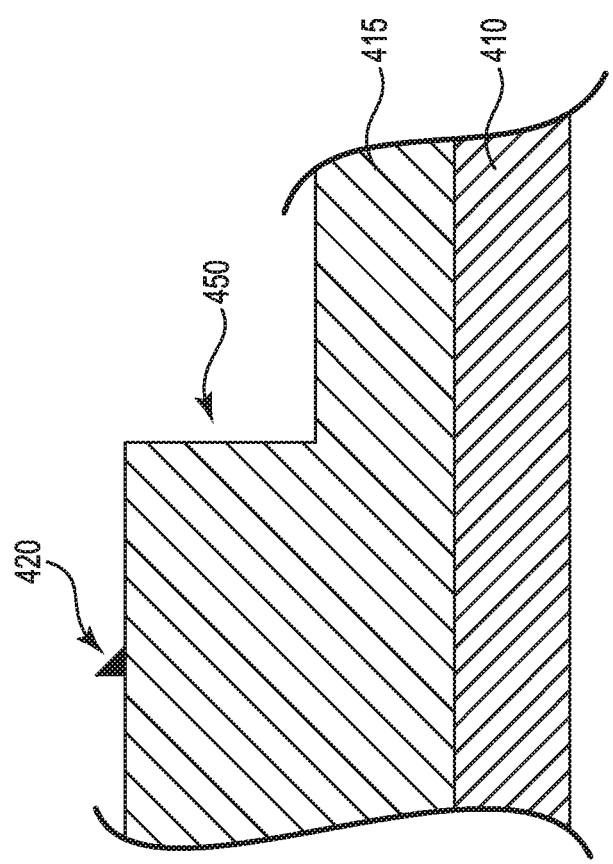
FIG. 4B shows a second cross-sectional, elevation view of FIG. 4A after a tier of photoresist material has been removed.

In some embodiments, the sidewall of photoresist that is transferred into a substrate is linear and forms an acute angle with respect to the second face portion (e.g., an angle that is less than 80 degrees such as between 40 and 70 degrees). Forming acute angles (also referred to as an "undercut") has additional advantages as described in connection with FIGS. 4A-5. As shown in FIG. 4A, sometimes debris 420 can accumulate in a corner 430 of a photoresist pattern 415 on a substrate 410 (e.g., an AlTiC substrate). As tier or layer 440 is removed, e.g., due to ion milling, the debris 420 can remain behind as a "hill" shown in FIG. 4B. Unfortunately, the "hill" can be transferred into the underlying substrate 410 after the remainder of the pattern 415 is milled away. Advantageously, embodiments of making an air-bearing surface according to the present disclosure can make a photoresist pattern having an "undercut" structure so as to avoid having material collect in corners such as corner 430. For example, FIG. 5 shows a photoresist pattern 500 on substrate 515 that could be made, e.g., via 3-D printing that has acute angles 505 between the side wall 503 of an overlying tier 501 and a face 504 of an underlying tier 502 so as to form an "undercut" structure. Such undercut structures can help avoid the accumulation of undesirable material to an undue degree.

FIG. 6 shows an embodiment where the sidewall of the photoresist that is transferred into a substrate is curvilinear. As shown in FIG. 6, pattern 650 on substrate 605 includes a layer 651. Layer 651 has a cross-sectional profile defined by a first major surface 652 separated by a distance from a second major surface 653 (shown by dotted line). The first major surface 652 has a first outer periphery 654 and the second major surface 653 has a second outer periphery 655 proximal to the first outer periphery 654. A sidewall 656 extends between the first outer periphery 654 and the second outer periphery 655. As shown in FIG. 6, the sidewall 656 is curvilinear.

What is claimed is:

1. A slider body comprising:
   an air bearing face, wherein the air bearing face comprises a leading edge and a trailing edge;
   two side faces, wherein each side face is adjacent to the air bearing face; and
   a trailing edge face that is adjacent to the trailing edge of the air bearing face, wherein the air bearing face has a topography comprising at least a first face portion, a second face portion and a third face portion, wherein the first and second face portions are opposite a disc media surface when positioned in a hard disc drive, wherein the first face portion is separated by a distance from the second face portion, wherein the first face portion has an outer periphery and the second face portion has an inner periphery proximal to the outer periphery, wherein a sidewall extends between the outer periphery and the inner periphery, wherein the sidewall from the outer periphery of the first face portion to the inner periphery of the second face portion is linear, wherein the linear sidewall forms an angle with respect to the second face portion, wherein the angle is an obtuse angle, wherein the third face portion is opposite a disc media surface when positioned in a hard disc drive, wherein the third face portion is separated by a distance from the second face portion, wherein the second face portion has an outer periphery and the third face portion has an inner periphery proximal to the outer periphery of the second face portion, wherein a sidewall extends between the outer periphery of the second face portion and the inner periphery of the third face portion, wherein the sidewall from the outer periphery of the second face portion to the inner periphery of the third face portion is linear or curvilinear, and wherein the linear sidewall forms an angle with respect to the third face portion, wherein the angle is an acute angle.

2. The slider body of claim 1, wherein the obtuse angle is between 120 and 150 degrees.

3. The slider body of claim 1, wherein the sidewall from the outer periphery of the second face portion to the inner periphery of the third face portion is linear and the angle between the linear sidewall and the third face portion is between 40 and 70 degrees.

4. The slider body of claim 1, wherein the sidewall from the outer periphery of the second face portion to the inner periphery of the third face portion is curvilinear.

5. The slider body of claim 1, wherein the obtuse angle is greater than 110 degrees.

6. The slider body of claim 1, wherein the sidewall from the outer periphery of the second face portion to the inner periphery of the third face portion is linear and the angle between the linear sidewall and the third face portion is less than 80 degrees.

7. The slider body of claim 1, further comprising a fourth face portion, wherein the fourth face portion is opposite a disc media surface when positioned in a hard disc drive, wherein the fourth face portion is separated by a distance from the third face portion, wherein the third face portion has an outer periphery and the fourth face portion has an inner periphery proximal to the outer periphery of the third face portion, wherein a sidewall extends between the outer periphery of the third face portion and the inner periphery of the fourth face portion, wherein the sidewall from the outer periphery of the third face portion to the inner periphery of the fourth face portion is linear or curvilinear, wherein a linear sidewall forms an angle with respect to the fourth face portion, wherein the angle is an obtuse angle or an acute angle.

8. A slider body comprising:
an air bearing face, wherein the air bearing face comprises a leading edge and a trailing edge;
two side faces, wherein each side face is adjacent to the air bearing face; and
a trailing edge face that is adjacent to the trailing edge of the air bearing face, wherein the air bearing face has a topography comprising at least a first face portion, a second face portion, and a third face portion, wherein the first, second, and third face portions are opposite a disc media surface when positioned in a hard disc drive, wherein the first face portion is separated by a distance from the second face portion, wherein the first face portion has an outer periphery and the second face portion has an inner periphery proximal to the outer periphery of the first face portion, wherein a sidewall extends between the outer periphery of the first face portion and the inner periphery of the second face portion, wherein the sidewall from the outer periphery of the first face portion to the inner periphery of the second face portion is linear or curvilinear, wherein the linear sidewall forms an angle with respect to the second face portion, wherein the angle is an acute angle, wherein the third face portion is separated by a distance from the second face portion, wherein the second face portion has an outer periphery and the third face portion has an inner periphery proximal to the outer periphery of the second face portion, wherein a sidewall extends between the outer periphery of the second face portion and the inner periphery of the third face portion, wherein the sidewall from the outer periphery of the second face portion to the inner periphery of the third face portion is linear, wherein the linear sidewall forms an angle with respect to the third face portion, wherein the angle is an obtuse angle.

9. The slider body of claim 8, wherein the angle between the linear sidewall and the third face portion is greater than 110 degrees.

10. The slider body of claim 8, wherein the angle between the linear sidewall and the third face portion is between 120 and 150 degrees.

11. The slider body of claim 8, wherein the angle between the linear sidewall and the second face portion is less than 80 degrees.

12. The slider body of claim 8, wherein the angle between the linear sidewall and the second face portion is between 40 and 70 degrees.

13. A slider body comprising:
an air bearing face, wherein the air bearing face comprises a leading edge and a trailing edge;
two side faces, wherein each side face is adjacent to the air bearing face; and
a trailing edge face that is adjacent to the trailing edge of the air bearing face, wherein the air bearing face has a topography comprising at least a first face portion, a second face portion, a third face portion and a fourth face portion, wherein the first and second face portions are opposite a disc media surface when positioned in a hard disc drive, wherein the first face portion is separated by a distance from the second face portion, wherein the first face portion has an outer periphery and the second face portion has an inner periphery proximal to the outer periphery, wherein a sidewall extends between the outer periphery of the first face portion and the inner periphery of the second face portion, wherein the sidewall is linear, wherein the linear sidewall forms an angle with respect to the second face portion, wherein the angle is an obtuse angle, wherein the third face portion is opposite a disc media surface when positioned in a hard disc drive, wherein the third face portion is separated by a distance from the second face portion, wherein the second face portion has an outer periphery and the third face portion has an inner periphery proximal to the outer periphery of the second face portion, wherein a sidewall extends between the outer periphery of the second face portion and the inner periphery of the third face portion, wherein the sidewall between the outer periphery of the second face portion and the inner periphery of the third face portion is linear or curvilinear, wherein a linear sidewall forms an angle with respect to the third face portion, wherein the angle is an obtuse angle or an acute angle, wherein the fourth face portion is opposite a disc media surface when positioned in a hard disc drive, wherein the fourth face portion is separated by a distance from the third face portion, wherein the third face portion has an outer periphery and the fourth face portion has an inner periphery proximal to the outer periphery of the third face portion, wherein a sidewall extends between the outer periphery of the third face portion and the inner periphery of the fourth face portion, wherein the sidewall is linear or curvilinear, and wherein a linear sidewall forms an angle with respect to the fourth face portion, wherein the angle is an obtuse angle or an acute angle.

14. The slider body of claim 13, wherein the angle between the linear sidewall and the second face portion is greater than 110 degrees.

15. The slider body of claim 13, wherein the angle between the linear sidewall and the second face portion is between 120 and 150 degrees.

16. The slider body of claim 13, wherein the angle between the linear sidewall and the second face portion is less than 80 degrees.

17. The slider body of claim 13, wherein the angle between the linear sidewall and the second face portion is between 40 and 70 degrees.

18. The slider body of claim 13, wherein the sidewall between the outer periphery of the second face portion and the inner periphery of the third face portion is linear and the angle between the linear sidewall and the third face portion is between 120 and 150 degrees and/or wherein the sidewall between the outer periphery of the third face portion and the inner periphery of the fourth face portion is linear and the angle between the linear sidewall and the fourth face portion is between 120 and 150 degrees.

19. The slider body of claim 13, wherein the sidewall between the outer periphery of the second face portion and the inner periphery of the third face portion is linear and the angle between the linear sidewall and the third face portion is less than 80 degrees and/or wherein the sidewall between the outer periphery of the third face portion and the inner periphery of the fourth face portion is linear and the angle between the linear sidewall and the fourth face portion is less than 80 degrees.

20. The slider body of claim 13, wherein the sidewall between the outer periphery of the second face portion and the inner periphery of the third face portion is linear and the angle between the linear sidewall and the third face portion is between 40 and 70 degrees and/or wherein the sidewall between the outer periphery of the third face portion and the inner periphery of the fourth face portion is linear and the angle between the linear sidewall and the fourth face portion is between 40 and 70 degrees.

* * * * *